United States Patent
Muramoto et al.

(10) Patent No.: US 8,680,566 B2
(45) Date of Patent: *Mar. 25, 2014

(54) SEMICONDUCTOR LIGHT EMITTING DEVICE INCLUDING OXIDE LAYERS WITH DIFFERENT OXYGEN CONTENTS

(71) Applicants: Eiji Muramoto, Kawasaki (JP); Shinya Nunoue, Ichikawa (JP)

(72) Inventors: Eiji Muramoto, Kawasaki (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/718,618

(22) Filed: Dec. 18, 2012

(65) Prior Publication Data

US 2013/0126937 A1 May 23, 2013

Related U.S. Application Data

(60) Division of application No. 13/165,837, filed on Jun. 22, 2011, which is a continuation of application No. PCT/JP2009/070238, filed on Dec. 2, 2009.

(30) Foreign Application Priority Data

Dec. 25, 2008 (JP) .................................. 2008-329619

(51) Int. Cl.
*H01L 33/00* (2010.01)

(52) U.S. Cl.
USPC ................................ 257/99; 257/79; 438/478

(58) Field of Classification Search
USPC .................. 257/103, 99, 62, 79, 101, 102, 22; 438/905, 904, 906, 488, 478
See application file for complete search history.

(56) References Cited

U.S. PATENT DOCUMENTS

| 5,793,054 A | 8/1998 | Nido |
| 6,806,571 B2 | 10/2004 | Shibata et al. |
| 2007/0096143 A1* | 5/2007 | Kim et al. ...................... 257/103 |
| 2008/0054278 A9* | 3/2008 | Ou et al. .......................... 257/95 |
| 2009/0173962 A1 | 7/2009 | Hanawa et al. |

FOREIGN PATENT DOCUMENTS

| JP | 09-008412 | 1/1997 |
| JP | 2001-196633 | 7/2001 |
| JP | 2005-244128 | 9/2005 |
| JP | 2007-073965 | 3/2007 |
| KR | 10-0703091 | 4/2007 |

OTHER PUBLICATIONS

International Search Report issued in International Application No. PCT/JP2009/070238 on Jan. 26, 2010.

(Continued)

*Primary Examiner* — Julio J Maldonado
*Assistant Examiner* — Robert Bachner
(74) *Attorney, Agent, or Firm* — Oblon, Spivak, McClelland, Maier & Neustadt, L.L.P.

(57) ABSTRACT

A semiconductor light emitting device includes an n-type semiconductor layer, a p-type semiconductor layer, and an active layer formed between the n-type semiconductor layer and the p-type semiconductor layer, and emitting light. The device further includes a p-electrode contacting to the p-type semiconductor layer, and including a first conductive oxide layer having an oxygen content lower than 40 atomic % and a second conductive oxide layer contacting to the first conductive oxide layer and having a higher oxygen content than the oxygen content of the first conductive oxide layer. The device also includes an n-electrode connecting electrically to the n-type semiconductor layer.

6 Claims, 7 Drawing Sheets

(56) References Cited

OTHER PUBLICATIONS

Office Action issued in Japanese Application No. 2008-329619 on Aug. 16, 2011 (with English Translation).
International Preliminary Report on Patentability and Written Opinion issued in International Application No. PCT/JP2009/070238 on Aug. 9, 2011.
Office Action issued in Korean Application No. 10-2011-7014724 on Jul. 31, 2012 (with English Translation).
Combined Chinese Office Action and Search Report issued Oct. 30, 2012, in Patent Application No. 200980152400.1 (with English-language translation).
Chinese Office Action issued Apr. 24, 2013 in Patent Application No. 200980152400.1 with English Translation.
Office Action mailed Sep. 10, 2013 in Chinese Application No. 200980152400.1 (w/English translation).

* cited by examiner

| SAMPLE | a(ITO 250nm) | b(ITO 250nm) | c(ITO 250nm) | d(ITO 250nm) |
|---|---|---|---|---|
| OXYGEN PARTIAL PRESSURE (Torr) | 0 | $1.0 \times 10^{-4}$ | $4.0 \times 10^{-4}$ | $7.0 \times 10^{-4}$ |
| CONTACT RESISTANCE ($\Omega \cdot cm^2$) | NOT MEASURED | $9.3 \times 10^{-3}$ | $1.7 \times 10^{-2}$ | $2.7 \times 10^{-2}$ |
| TRANSMITTANCE (%) (AFTER HEAT TREATMENT) | 31 | 78 | 94 | 95 |
| RESISTIVITY ($\Omega \cdot cm$) | $5 \times 10^{-3}$ OR HIGHER | $7.6 \times 10^{-4}$ | $4.9 \times 10^{-4}$ | $1.6 \times 10^{-3}$ |
| OXYGEN CONTENT (ATOMIC %) | 5 | 35.4 | 61 | 65 |

"NOT MEASURED" MEANS THAT SHEET RESISTANCE OF ITO WAS TOO HIGH TO BE MEASURED

FIG. 2

| SAMPLE | e (ITO 250nm) | f (ITO 250nm) | g (ITO 250nm) |
|---|---|---|---|
| OXYGEN PARTIAL PRESSURE OF SECOND ITO LAYER (Torr) | $4.0 \times 10^{-4}$ | $4.0 \times 10^{-4}$ | $4.0 \times 10^{-4}$ |
| OXYGEN PARTIAL PRESSURE OF FIRST ITO LAYER (Torr) | 0 | 0 | 0 |
| FILM THICKNESS OF FIRST ITO LAYER (nm) | 10 | 30 | 50 |
| CONTACT RESISTANCE ($\Omega \cdot cm^2$) | $1.1 \times 10^{-2}$ | $5.8 \times 10^{-3}$ | $6.5 \times 10^{-3}$ |
| TRANSMITTANCE (%) (AFTER HEAT TREATMENT) | 95 | 93 | 90 |
| RESISTIVITY ($\Omega \cdot cm$) | $4.1 \times 10^{-4}$ | $5.2 \times 10^{-4}$ | $7.5 \times 10^{-4}$ |

SEMICONDUCTOR LIGHT EMITTING DEVICE INCLUDING OXIDE LAYERS WITH DIFFERENT OXYGEN CONTENTS

CROSS-REFERENCE TO RELATED APPLICATIONS

This application is a division of U.S. application Ser. No. 13/165,837 filed Jun. 22, 2011, which is based upon and claims the benefit of priority from the prior Japanese Patent Application No. 2008-329619, filed Dec. 25, 2008 in Japan and PCT/JP2009/70238 filed Dec. 2, 2009, the entire contents of each of which are incorporated herein by reference.

FIELD

Embodiments described herein relate generally to a semiconductor light emitting device.

BACKGROUND

As a semiconductor light emitting device, there is a known structure in which an n-type semiconductor layer to be a contact layer, an n-type cladding layer, an active layer, a p-type cladding layer, and a p-type semiconductor layer to be a contact layer are normally stacked on a substrate, and an n-electrode and a p-electrode to be ohmic electrodes are formed on the n-type semiconductor layer and the p-type semiconductor layer to be the contact layers, respectively. To extract light from the side of the p-type semiconductor layer in the semiconductor light emitting device, indium tin oxide (ITO) having a high transmittance is normally used as the p-electrode. However, because of the low ohmic properties of ITO, a device with excellent properties is difficult to manufacture only with ITO. In view of that, there is a suggested structure in which a metal oxide layer made of an element other than In and Sn is provided between ITO and a contact layer to improve contact properties and transmission properties.

However, there exists ITO sandwiching the region of the metal oxide layer, and the transmittance of the ITO cannot be utilized as it is. Also, since a metal oxide other than ITO is used, different etching conditions from those of ITO are required, and the manufacturing process becomes complicated.

BRIEF DESCRIPTION OF THE DRAWINGS

FIG. 2 shows simulation results for explaining the effects of the semiconductor light emitting device according to the first embodiment;

FIG. 5 shows simulation results for explaining the effects of the semiconductor light emitting device according to the first embodiment;

DETAILED DESCRIPTION

A semiconductor light emitting device according to an embodiment includes: a substrate; an n-type semiconductor layer formed on the substrate; an active layer formed on a first region of the n-type semiconductor layer, and emitting light; a p-type semiconductor layer formed on the active layer; a p-electrode formed on the p-type semiconductor layer, and including a first conductive oxide layer having an oxygen content lower than 40 atomic %; and an n-electrode formed on a second region of the n-type semiconductor layer.

The following is a description of embodiments, with reference to the accompanying drawings.

First Embodiment

Figure 1:
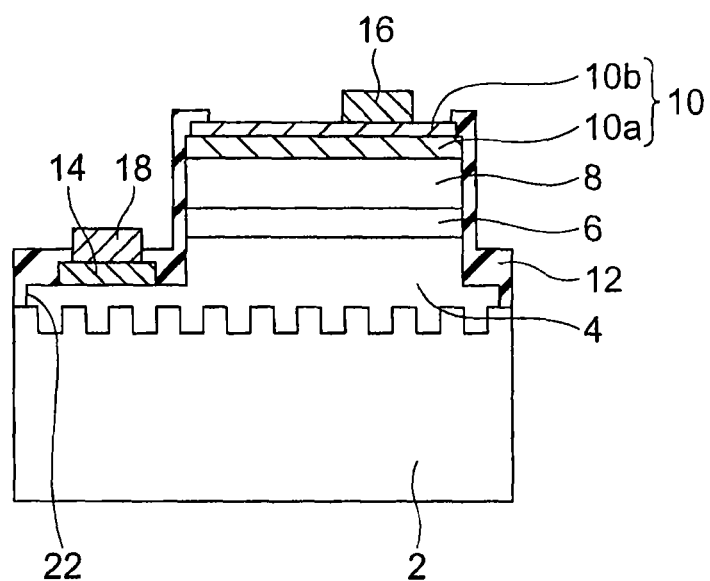
FIG. 1 is a cross-sectional view of a semiconductor light emitting device according to a first embodiment.

FIG. 1 is a cross-sectional view of a semiconductor light emitting device according to a first embodiment. The semiconductor light emitting device of this embodiment is manufactured in the following manner.

First, as shown in FIG. 1, after an undoped GaN buffer layer (not shown) is formed on a sapphire substrate 2 by metal organic chemical vapor deposition (MOCVD), molecular beam epitaxy (MBE), or the like, an n-type GaN layer 4 is then formed on the buffer layer. Here, a processed substrate having concavities and convexities formed in a surface thereof to increase light extraction efficiency may be used as the sapphire substrate 2 as shown in FIG. 1, or a flat substrate having neither concavities nor convexities in a surface thereof may be used as the sapphire substrate 2.

An active layer 6 made of InGaN is then formed on the n-type GaN layer 4 by MOCVD, MBE, or the like. The active layer 6 made of InGaN has a single quantum well (SQW) structure or a multiple quantum wells (MQW) structure. Further, a cladding layer (not shown) made of p-type AlGaN and a p-type GaN layer 8 are formed in this order by MOCVD or the like on the active layer 6 made of InGaN. The substrate formed in this manner is subjected to a heat treatment in a rapid thermal annealing (RTA) furnace or the like, to facilitate activation of the p-type impurities in the p-type GaN layer 8.

Next, a transparent p-electrode 10 is formed on the p-type GaN layer 8. The method of forming the transparent p-electrode 10 will be described later in detail. After the formation of the p-electrode 10, a lithography technique and an etching technique such as reactive ion etching (RIE) are used to partially remove the stacked film of the p-electrode 10, the p-type GaN layer 8, the cladding layer (not shown) made of p-type AlGaN, and the active layer 6 made of InGaN and expose the surface of the GaN layer 4 through the bottom surface, and to partially remove the exposed n-type GaN layer 4. The removal may be performed by wet etching, instead of RIE.

A transparent insulating film 12 is then formed on the entire surface by CVD or the like. A SiO$_2$ film or the like is used as the transparent insulating film. Part of the transparent insulating film 12 on the n-type GaN layer 4 is then removed by a lithography technique and a wet etching technique or the like, to expose the n-type GaN layer 4. After that, an n-electrode 14 is formed on the exposed n-type GaN layer 4 by a vacuum vapor deposition technique and a liftoff technique. The n-electrode 14 is a stacked film containing Ti and Al, and more specifically, a four-layer stacked structure formed by stacking Ti, Al, Ti, and Pt in this order from the bottom is used as the n-electrode 14. Annealing at a temperature of 650° C. is performed on the n-electrode 14 in a nitrogen atmosphere, to improve the ohmic contact properties of the n-electrode 14.

The transparent insulating film 12 on the p-electrode 10 is then partially removed by a lithography technique and a wet etching technique, to expose part of the upper surface of the p-electrode 10. A pad electrode 16 for bonding is formed on the exposed p-electrode 10 by a vacuum vapor deposition technique, and a pad electrode 18 for bonding is also formed on the n-electrode 14. A stacked film formed by stacking Ti, Pt, and Au in this order from the bottom or a stacked film formed by stacking Ni and Au in this order from the bottom may be used for each of the pad electrodes 16 and 18, so that Au is used as the upper layer, and Ni or Ti, which has high adhesiveness, is used as the interface with the n-electrode 14 or the p-electrode 10.

Lastly, device isolating grooves 22 that reach the sapphire substrate 2 are formed by a lithography technique and a RIE technique, so as to facilitate formation of chips. After that, a transparent insulating film 12 that covers the side faces of the device insulating grooves 22 is formed by CVD, a sputtering technique, a vapor deposition technique, or the like.

The p-electrode 10 of this embodiment is made of a transparent conductive oxide such as ITO, and includes a first ITO layer 10a and a second ITO layer 10b formed on the first ITO layer 10a. The first ITO layer 10a has a layer thickness of 100 nm or smaller, for example, and is designed to contain a smaller amount of oxygen than the second ITO layer 10b. With this arrangement, the first ITO layer 10a becomes an ITO layer having many oxygen defects, and is put into a metal-like state with a low contact resistance. On the other hand, the second ITO layer 10b is an ITO layer having such an oxygen content that the ITO layer excels in transmittance and electric conductivity. With this arrangement, a p-electrode 10 having a low contact resistance and excellent transmission properties and electric conduction properties can be obtained. If the thickness of the p-electrode 10 is 100 nm or smaller, the second ITO layer 10b may not be provided, and the p-electrode 10 may be formed only with the first ITO layer 10a.

The p-electrode 10 made of ITO may be formed by an electron beam deposition technique, for example. First, the substrate temperature is set at approximately 200 to 450° C., and the vapor deposition rate is set at 0.1 nm/sec to 1.5 nm/sec. Oxygen is not introduced, and the back pressure is set at a normally recommended degree of vacuum ($1.0 \times 10^{-5}$ Torr or lower). Electron beams are emitted onto an ITO sintered material, to form the first ITO layer 10a having a layer thickness of 10 nm to 100 nm on the p-type GaN layer 8. At this point, the layer thickness of the first ITO layer 10a depends on a desired transmittance and sheet resistance, and therefore, is not necessarily limited to 10 nm to 100 nm.

Oxygen is then introduced at the above temperature and at the above vapor deposition rate so that the oxygen partial pressure becomes $1.0 \times 10^{-4}$ Torr to $1.0 \times 10^{-3}$ Torr. In this manner, the second ITO layer 10b with an excellent electric conductivity and excellent transmission properties is formed. At this point, the second ITO layer 10b can be formed while the oxygen inflow is increased continuously from the formation of the first ITO layer 10a, and the distinction between the oxygen introduction into the first ITO layer 10a and the oxygen introduction into the second ITO layer 10b may not exist.

Referring now to FIG. 2, the oxygen partial pressure dependence at the time of film formation is first described in relation to the properties of ITO layers. Four ITO layer samples a, b, c, and d that were all single-layer ITO layers each having a film thickness of 250 nm and were designed so that the respective oxygen partial pressures became 0 Torr, $1.0 \times 10^{-4}$ Torr, $4.0 \times 10^{-4}$ Torr, and $7.0 \times 10^{-4}$ Torr were prepared. FIG. 2 shows the results of examinations carried out to measure the contact resistance ($\Omega cm^2$), transmittance (%), resistivity (sheet resistance), and oxygen content (atomic %) of each of the samples a, b, c, and d. It should be noted that each transmittance value shown therein is a value measured after the respective ITO layers were subjected to a heat treatment. As can be seen from FIG. 2, the contact resistance tends to be lower where the oxygen partial pressure is lower. On the other hand, the transmittance tends to be higher where the oxygen partial pressure is higher. Therefore, it is difficult to achieve a low contact resistance and excellent transmittance at the same time.

Figure 3:
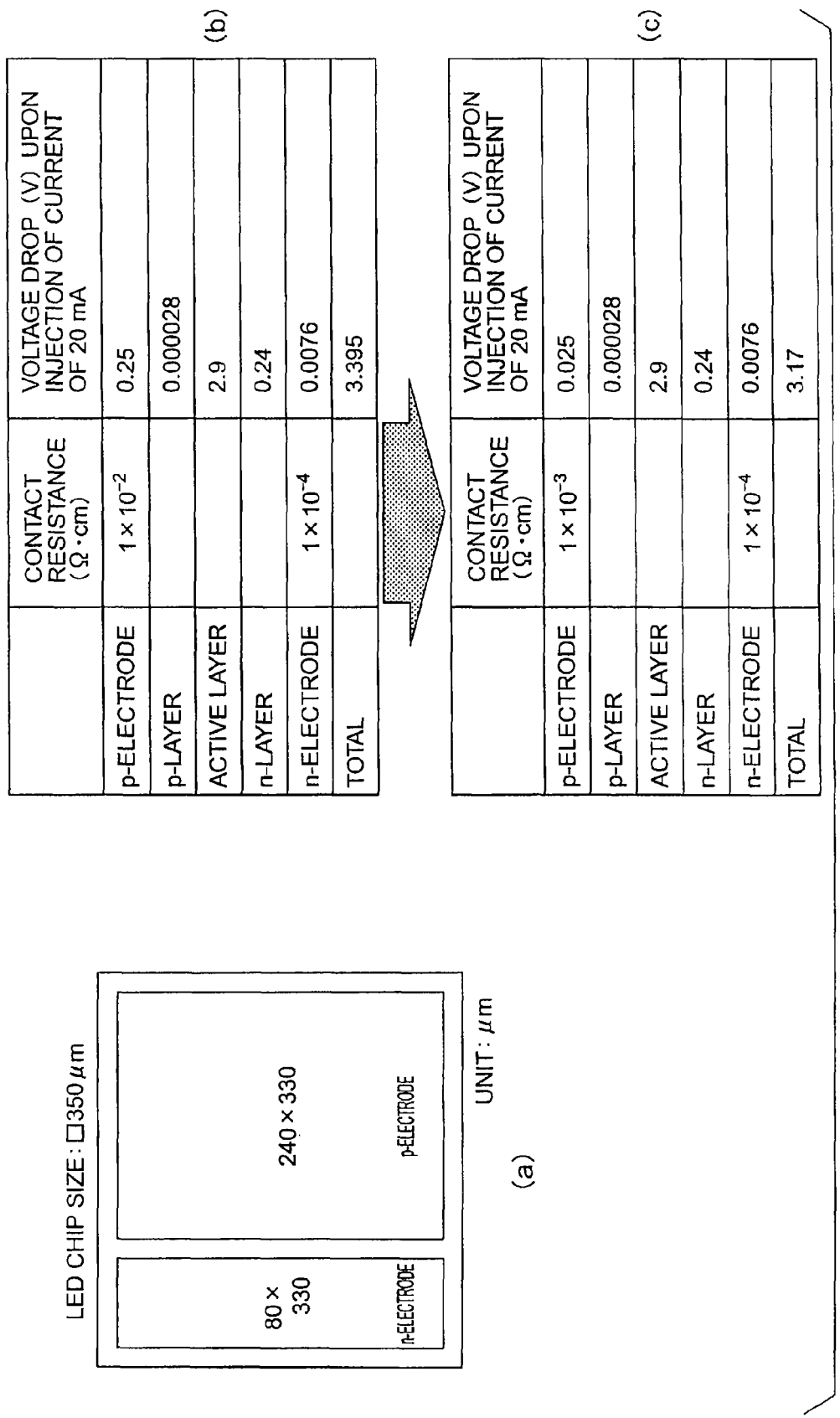
FIGS. 3(*a*) to 3(*c*) show simulation results for explaining the effects of the semiconductor light emitting device according to the first embodiment.

In view of that, to achieve a preferred contact resistance for the first ITO layer 10a, the inventors performed a voltage drop simulation on semiconductor light emitting devices each having an n-electrode and a p-electrode formed on a stacked film including an n-type semiconductor layer, an active layer, and a p-type semiconductor layer, as shown in FIGS. 3(a), 3(b), and 3(c). In this simulation, a semiconductor light emitting device in which the contact resistance of the p-electrode was $1 \times 10^{-2}$ ($\Omega \cdot cm$), and a semiconductor light emitting device in which the contact resistance of the p-electrode was $1 \times 10^{-3}$ ($\Omega \cdot cm$) were prepared. A current of 20 mA was applied to those semiconductor light emitting devices, and voltage drops in the respective layers of those semiconductor light emitting devices were calculated. As can be seen from FIGS. 3(b) and 3(c), where the contact resistance of the p-electrode was $1 \times 10^{-3}$ ($\Omega \cdot cm$), the voltage drop in the p-electrode is a tenth of the voltage drop in the p-electrode having the contact resistance of $1 \times 10^{-2}$ ($\Omega \cdot cm$), and an approximately 6% drop in drive voltage can be achieved in the semiconductor light emitting device. Accordingly, in this embodiment, the contact resistance of the first ITO layer 10a is preferably lower than $1 \times 10^{-2}$ ($\Omega \cdot cm$), and with such a value, a preferred contact resistance can be achieved.

Figure 4:
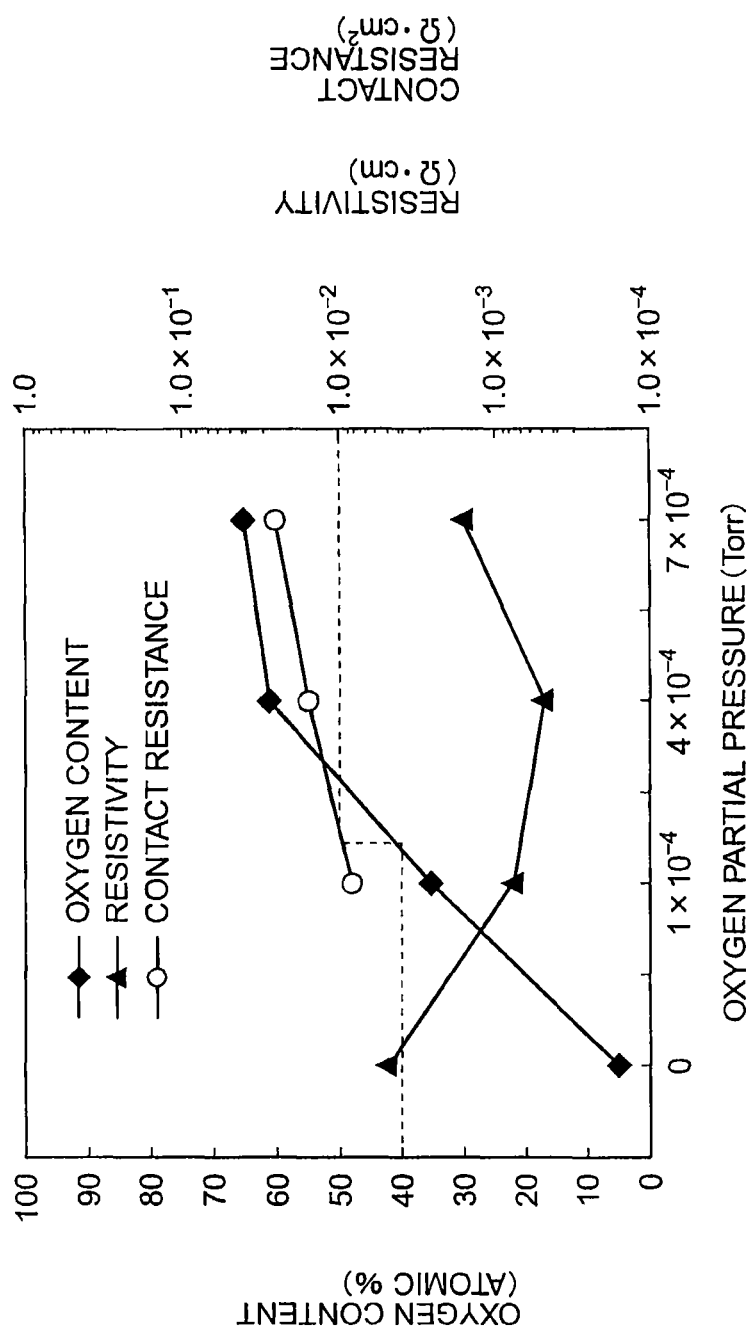
FIG. 4 is a graph in which the simulation results shown in FIG. 2 are plotted.

FIG. 4 is a graph in which the oxygen partial pressure dependences of the resistivity, oxygen content, and contact resistance of each of the samples a, b, c, and d are plotted based on the measurement results shown in FIG. 2. As can be seen from the graph shown in FIG. 4, the lowest resistivity is observed when the oxygen partial pressure is almost $4 \times 10^{-4}$ (Torr), and the resistivity becomes higher whether the oxygen partial pressure becomes lower or higher than that value. It is natural that the oxygen content and the contact resistance become higher with an increase in oxygen partial pressure. As described above, the contact resistance of the first ITO layer 10a is preferably lower than $1 \times 10^{-2}$ ($\Omega \cdot cm$). Therefore, as can be seen from FIG. 4, the oxygen content in the first ITO layer 10a is preferably higher than 0 atomic % and lower than 40 atomic %, and more preferably, is 5 atomic % or higher and lower than 40 atomic %

Next, three different samples e, f, and g are prepared in relation to ITO electrodes each having a first ITO layer and a second ITO layer formed on the first ITO layer, like the p-electrode made of ITO according to this embodiment. The samples e, f, and g each have a film thickness of 250 nm. The oxygen partial pressure at the time of film formation of each first ITO layer is 0 Torr, and the oxygen partial pressure at the time of film formation of each second ITO layer is $4.0 \times 10^{-4}$ Torr. The layer thicknesses of the first ITO layers are 10 nm, 30 nm, and 50 nm, respectively. FIG. 5 shows the results of examinations carried out on the contact resistance ($\Omega \cdot cm^2$), transmittance (%), and resistivity of each of those samples e, f, and g. It should be noted that each transmittance value is a value measured after the ITO layer is subjected to a heat treatment. As can be seen from FIG. 5, the contact resistance cannot be made lower when the thickness of the first ITO layer is approximately 10 nm. Where the first ITO layer is provided (in the case of any of the samples e, f, and g), the contact resistance is about a third of the contact resistance of the sample c or d shown in FIG. 2, which has the same or higher oxygen partial pressure at the time of film formation. In the case of any of the samples e, f, and g, the transmittance is 90% or higher, and the resistivity is $1.0\times10^{-3}$ ($\Omega\cdot$cm) or lower. Accordingly, it is apparent that almost the same properties as those of a p-electrode formed with a single-layer ITO film by a conventional vapor deposition technique can be achieved.

JP-A 2005-244128 (KOKAI) discloses a semiconductor light emitting device that has a p-electrode formed by introducing oxygen into a conductive oxide film containing at least one element selected from the group consisting of zinc, indium, tin, and magnesium, and controlling the oxygen concentration to become the highest in the surface on the opposite side from a semiconductor stacked film on which the p-electrode is located. In the semiconductor light emitting device disclosed in JP-A 2005-244128 (KOKAI), the conductive oxide film has a low-sheet-resistance layer or a low-resistivity layer on the side of the interface with the semiconductor stacked film.

The sheet resistance of a conductive oxide, which may be ITO, for example, normally depends on the amount of oxygen defects. If the amount of oxygen defects becomes smaller, the amount of carriers becomes smaller, and the resistivity becomes higher. If the amount of oxygen defects is too small, the crystallinity is degraded, the carrier mobility becomes lower, and the resistivity becomes higher. That is, the properties illustrated in FIG. 4 are obtained. An ITO layer with a low sheet resistance or a low-resistivity ITO layer has a resistivity of about $1\times10^{-4}$ ($\Omega\cdot$cm), and has an oxygen content of about 61 atomic %, as can be seen from FIG. 4. In an ITO layer having a resistivity of $1\times10^{-4}$ ($\Omega\cdot$cm), the carrier density is $1.0\times10^{20}$ to $1.0\times10^{21}$ (atoms/cm$^3$), and the visible light transmittance is 90% or higher.

Therefore, in the semiconductor light emitting device disclosed in JP-A 2005-244128 (KOKAI), the oxygen content in the above described p-electrode layer (equivalent to the first ITO layer of this embodiment) on the side of the interface with the semiconductor stacked film is about 61 atomic %, which is lower than the oxygen content in the other portions of the p-electrode.

In the semiconductor light emitting device of this embodiment, on the other hand, the oxygen content in the first ITO layer is lower than 40 atomic %, as can be seen from FIG. 4. Therefore, the first ITO layer of this embodiment has a somewhat poorer crystallinity and higher sheet resistance (resistivity), compared with the p-electrode layer of the semiconductor light emitting device disclosed in JP-A 2005-244128 (KOKAI). In this embodiment, however, an ITO layer with high carrier density (high conduction electron concentration) is used as the first ITO layer. Accordingly, a higher contact resistance and higher ohmic properties can be achieved, compared with the semiconductor light emitting device disclosed in JP-A 2005-244128 (KOKAI). In this embodiment, to lower the sheet resistance of the entire p-electrode and to improve the transmittance of the entire p-electrode, a second ITO layer having a low sheet resistance and a high transmittance is stacked on the first ITO layer.

As described above, according to this embodiment, a semiconductor light emitting device including an electrode that excels in ohmic properties and transmission properties and can be easily processed can be obtained.

The p-electrode made of ITO according to this embodiment has the advantage that the side etching can be 1 µm or shorter even if the p-electrode is subjected to etching 50% longer than the etching time converted from the etching rate, and the p-electrode can be processed without residues. This aspect is described below. In the first ITO layer 10a, the crystal grains are smaller than those in the second ITO layer 10b having oxygen introduced thereinto. The ITO layer 10a having the smaller crystal grains has a higher etching rate than that of the second ITO layer 10b having higher conductive properties and higher transmission properties. At the time of wet etching, the etchant penetrating through the narrow spaces between the crystal grains first etches the first ITO layer 10a, and then also etches the second ITO layer 10b as the upper layer. The etching rate at this point is set as A. The side etching correlates with the low etching rate of the second ITO layer as the upper layer. This etching rate is set as B. Normally, the etching rate A is equal to the etching rate B where a p-electrode made of ITO is formed with a single layer, and large side etching is performed in the case of 50% overetching. Therefore, it is difficult to set such an etching period of time as to reduce the side etching and perform etching without residues. In the ITO electrode according to this embodiment, however, the etching rate A of the first ITO layer is much higher than the etching rate B of the second ITO layer (that is, A>>B). Therefore, it is possible to take a sufficient etching period of time so as not to form residues.

Subjected to a heat treatment in nitrogen at 500° C. to 800° C., the p-electrode 10 formed with ITO layers according to this embodiment can have excellent contact properties. This is supposedly because, through the heat treatment, a small amount of reacted In dispersed from the p-electrode 10 made of ITO toward the p-type GaN layer 8 forms an InGaN narrow band layer that allows easier tunneling of carriers. In this embodiment, the first ITO layer 10a is in a metal-like state as described above, and has poorer crystallinity than the second ITO layer 10b with high conductive properties and high transmission properties. Therefore, through the heat treatment, the In is easily dispersed toward the p-type GaN layer 8, and the contact resistance becomes lower than that of a regular ITO electrode. In view of this, the heat treatment temperature should be as high as possible, and preferably is in the neighborhood of 700° C. This is because GaN crystals normally grow at 700° C. or higher, and accordingly, 700° C. is a temperature that does not damage the crystals and is high enough to facilitate an interfacial reaction in the easiest manner.

In this embodiment, the p-electrode 10 made of ITO may be formed by a sputtering technique, for example. Since the energy of dispersed particles is high in the film formation by a sputtering technique, the substrate temperature at the time of film formation can be set in the range of ordinary temperature to 300° C.

Figure 6:
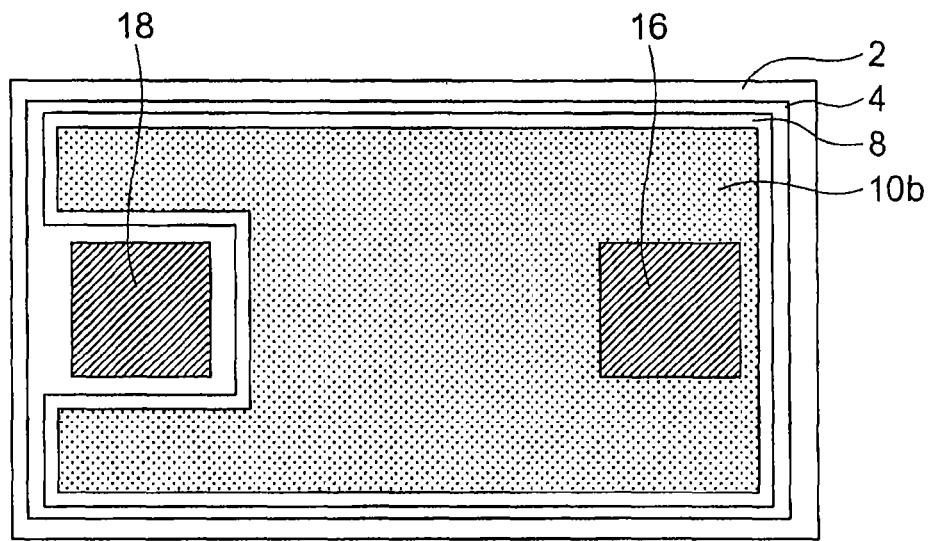
FIG. 6 shows a specific example of arrangement of the electrodes of the semiconductor light emitting device according to the first embodiment.
Figure 7:
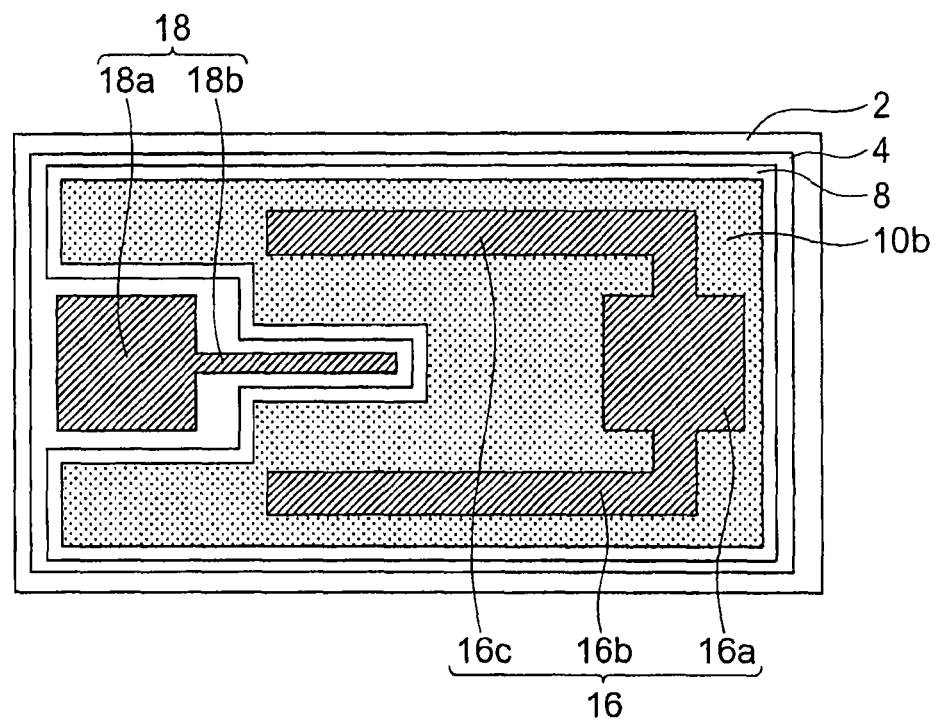
FIG. 7 shows another specific example of arrangement of the electrodes of the semiconductor light emitting device according to the first embodiment.

In the semiconductor light emitting device of this embodiment, the p-side pad electrode 16 and the n-side pad electrode 18 are formed for wire bonding. The p-side pad electrode 16 and the n-side pad electrode may be formed near both ends of the upper surface of the semiconductor light emitting device, as shown in FIG. 6. FIG. 6 is a top view of the semiconductor light emitting device of this embodiment. Also, as shown in FIG. 7, the n-side pad electrode 18 may include a pad portion 18a formed near one end of the semiconductor light emitting device, and a thin-line portion 18b extending from the pad portion 18a toward the p-side pad electrode 16. The p-electrode 16 may include a pad portion 16a formed near the other end of the semiconductor light emitting device, and two thin-line portions 16b and 16c extending from the pad portion 16a toward the n-side pad electrode 18. With those thin-line portions, current can spread more efficiently. It should be noted that the p-side pad electrode 16 and the n-side pad electrode 18 can have round shapes, instead of square shapes. The p-side pad electrode 16 and the n-side pad electrode 18 can not be located near both ends. Instead, one of the pad electrodes can be located near the center of the upper surface of the semiconductor light emitting device.

In the first embodiment, the transparent insulating film 12 is made of $SiO_2$, for example. The transparent insulating film 12 may be formed by a technique such as CVD, a sputtering technique, or a vapor deposition technique. The transparent insulating film 12 is not necessarily made of $SiO_2$, but may be made of $TiO_2$ or the like, as long as the insulating film 12 has insulating properties.

Figure 8:
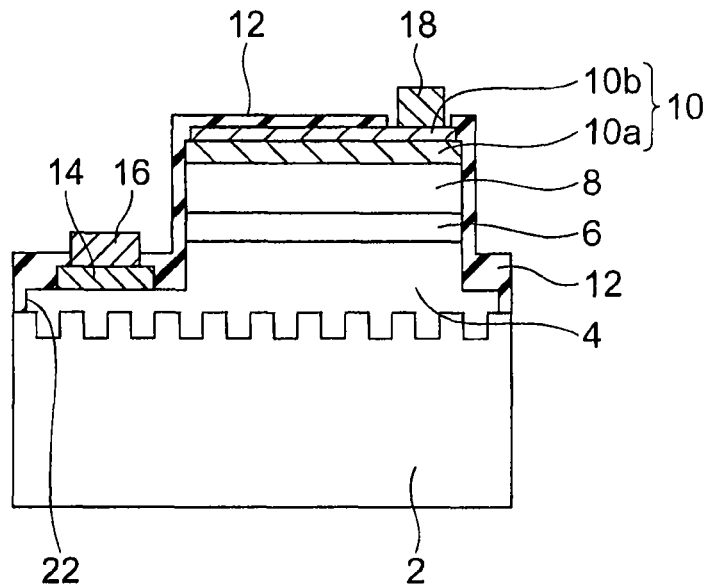
FIG. 8 is a cross-sectional view of the semiconductor light emitting device according to a modification of the first embodiment.

In the first embodiment, the transparent insulating film 12 is not formed on the ITO electrode 10. However, the transparent insulating film 12 may be formed on the p-electrode 10 made of ITO, as in a semiconductor light emitting device according to a modification of the first embodiment shown in FIG. 8. In this case, the refractive index n of the transparent insulating film 12 is preferably lower than the refractive index (about 2.0) of the p-electrode 10 made of ITO, and the film thickness d of the transparent insulating film 12 should be designed to satisfy the following condition:

$$m \cdot \lambda/4 = n \cdot d \text{ (}m\text{ being an even number)}$$

where λ represents the wavelength of light to be transmitted and extracted. In this modification, the transparent insulating film 12 is formed on the p-electrode 10 made of ITO, so that the light extraction efficiency and reliability can be improved.

Second Embodiment

Figure 9:
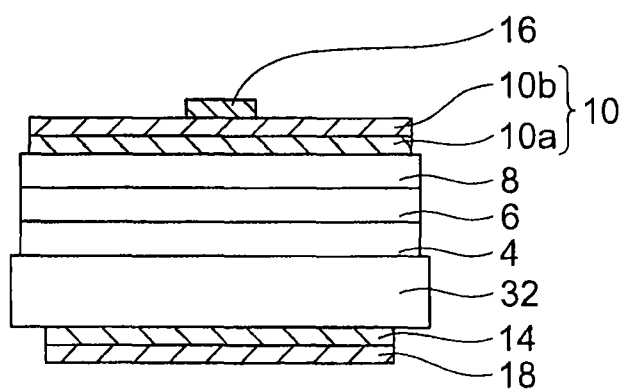
FIG. 9 is a cross-sectional view of a semiconductor light emitting device according to a second embodiment.

FIG. 9 shows a semiconductor light emitting device according to a second embodiment. The semiconductor light emitting device of this embodiment is a semiconductor light emitting device having crystals grown on a GaN substrate 32. That is, the semiconductor light emitting device of this embodiment has a structure in which an n-type GaN layer 4, an InGaN active layer 6, a p-type GaN layer 8, a first ITO layer 10a, and a second ITO layer 10b are sequentially stacked on the GaN substrate 32. The first ITO layer 10a and the second ITO layer 10b constitute a p-electrode 10. A p-side pad electrode 16 is formed on the p-electrode 10, and an n-electrode 14 is formed on the surface of the GaN substrate 32 on the opposite side from the n-type GaN layer 4. An n-side pad electrode 18 is formed on the surface of the n-electrode 14 on the opposite side from the GaN substrate 32.

Crystals are grown on a GaN substrate in the same manner as crystals grown on a sapphire substrate. Normally, crystals on a GaN substrate have a low dislocation density and high light emission efficiency. If substrates become less expensive, GaN substrates will be often used in the future. Where a GaN substrate is used, the n-electrode 14 can be formed on the substrate as shown in FIG. 9, since the substrate has conductive properties. If a Ti/Al based electrode is used as the n-electrode 14, low contact properties can be expected as in a case where a sapphire substrate is used.

The second embodiment can achieve the same effects as those of the first embodiment.

Although ITO is used as the material of the p-electrode in each of the first and second embodiments, a conductive oxide containing at least one element selected from the group consisting of In, Zn, Sn, Ni, Mg, Cu, Au, Pd, Rh, and Ga may be used.

As described so far, in each of the embodiments, a conductive oxide layer having an oxygen content lower than 40 atomic % is used as a p-electrode in a region in contact with a semiconductor stacked film, and a conductive oxide layer having a low sheet resistance and a high transmittance is formed over the conductive oxide layer. With this arrangement, a semiconductor light emitting device that has high light extraction efficiency and a low drive voltage at the same time can be obtained. Also, residues at the time of wet etching can be reduced.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. A semiconductor light emitting device comprising:
    an n-type semiconductor layer;
    a p-type semiconductor layer;
    an active layer formed between the n-type semiconductor layer and the p-type semiconductor layer, and emitting light;
    a p-electrode contacting to the p-type semiconductor layer, and including a first conductive oxide layer having an oxygen content lower than 40 atomic % and a second conductive oxide layer contacting to the first conductive oxide layer and having a higher oxygen content than the oxygen content of the first conductive oxide layer, the crystal grains in the first conductive oxide layer being smaller than crystal grains in the second conductive oxide layer; and
    an n-electrode connecting electrically to the n-type semiconductor layer.

2. The device according to claim 1, wherein the first conductive oxide layer contains at least one element selected from the group consisting of In, Zn, Sn, Ni, Mg, Cu, Au, Pd, Rh, and Ga.

3. The device according to claim 1, wherein the first conductive oxide layer has a contact resistance lower than $1 \times 10^{-2}$ Ω·cm.

4. The device according to claim 1, wherein the first conductive oxide layer has a film thickness that is not smaller than 10 nm and not greater than 100 nm.

5. The device according to claim 1, wherein the second conductive oxide layer has a higher transmittance than a transmittance of the first conductive oxide layer.

6. The device according to claim 1, wherein the second conductive oxide layer has an oxygen content more than 61 atomic %.

* * * * *